(12) United States Patent
Lee et al.

(10) Patent No.: US 10,693,068 B2
(45) Date of Patent: Jun. 23, 2020

(54) ORGANIC LIGHT-EMITTING DISPLAY APPARATUS AND METHOD OF MANUFACTURING THE SAME

(71) Applicant: SAMSUNG DISPLAY CO., LTD., Yongin-si, Gyeonggi-do (KR)

(72) Inventors: Joongu Lee, Yongin-si (KR); Yeonhwa Lee, Yongin-si (KR); Sehoon Jeong, Yongin-si (KR); Jiyoung Choung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/657,439

(22) Filed: Jul. 24, 2017

(65) Prior Publication Data

US 2018/0033968 A1 Feb. 1, 2018

(30) Foreign Application Priority Data

Aug. 1, 2016 (KR) .......................... 10-2016-0098043

(51) Int. Cl.
*H01L 51/50* (2006.01)
*H01L 51/52* (2006.01)
(Continued)

(52) U.S. Cl.
CPC ...... *H01L 51/0016* (2013.01); *H01L 27/3246* (2013.01); *H01L 51/001* (2013.01);
(Continued)

(58) Field of Classification Search
CPC ............ H01L 51/0011; H01L 51/0016; H01L 51/0021; H01L 51/0023; H01L 51/5203;
(Continued)

(56) References Cited

U.S. PATENT DOCUMENTS 7,692,375 B2 * 4/2010 Shimizu .............. H01L 51/5234
313/504
7,898,172 B2 * 3/2011 Shimizu .............. H01L 51/5234
313/504
(Continued)

FOREIGN PATENT DOCUMENTS

JP 10-261490 A 9/1998
JP 2002-170669 A 6/2002
(Continued)

*Primary Examiner* — Mary A Wilczewski
(74) *Attorney, Agent, or Firm* — Lewis Roca Rothgerber Christie LLP

(57) ABSTRACT

Provided are an organic light-emitting display apparatus and a method of manufacturing the same. The organic light-emitting display apparatus includes a substrate; lower electrodes, the lower electrodes being on the substrate and spaced apart from one another; a pixel-defining film, the pixel-defining film having portions that cover ends of the lower electrodes; upper electrodes, an upper electrode corresponding to each lower electrode, each upper electrode including a first portion contacting the corresponding lower electrode and a second portion contacting the pixel-defining film; organic functional layers, each including an emission layer, an organic functional layer corresponding to each upper electrode and disposed thereon; and an electrode on the organic functional layers.

17 Claims, 20 Drawing Sheets

(51) Int. Cl.
   *H01L 51/56* (2006.01)
   *H01L 27/32* (2006.01)
   *H01L 51/00* (2006.01)
(52) U.S. Cl.
   CPC ...... *H01L 51/0011* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/5218* (2013.01); *H01L 51/5228* (2013.01); *H01L 51/56* (2013.01); *H01L 2251/301* (2013.01); *H01L 2251/5315* (2013.01)
(58) Field of Classification Search
   CPC . H01L 51/5206; H01L 51/56; H01L 51/5218; H01L 27/3246; H01L 51/5212; H01L 51/5228; H01L 51/5012; H01L 51/5056; H01L 51/5072; H01L 51/5088; H01L 51/5092; H01L 2251/301; H01L 2251/5315
   See application file for complete search history.

(56) References Cited

U.S. PATENT DOCUMENTS

| | | | | |
|---|---|---|---|---|
| 8,772,762 B2* | 7/2014 | Kaneta | ............... | H01L 51/5206 257/13 |
| 8,816,579 B2* | 8/2014 | Kim | ............... | H01L 51/5215 257/88 |
| 9,076,993 B2* | 7/2015 | Kim | ............... | H01L 27/3246 |
| 9,825,250 B2* | 11/2017 | Yokota | ............... | H01L 51/5215 |
| 9,911,795 B2* | 3/2018 | Hou | ............... | H01L 27/3246 |
| 10,431,742 B2* | 10/2019 | Kim | ............... | G03F 7/26 |
| 2006/0238111 A1 | 10/2006 | Shimizu et al. | | |
| 2012/0181554 A1 | 7/2012 | Irving et al. | | |
| 2013/0038203 A1* | 2/2013 | Kim | ............... | H01L 51/5215 313/504 |
| 2013/0069067 A1* | 3/2013 | Youn | ............... | H01L 27/3246 257/59 |
| 2014/0239262 A1* | 8/2014 | Kim | ............... | H01L 51/5212 257/40 |
| 2016/0126489 A1* | 5/2016 | Yokota | ............... | H01L 51/5215 257/40 |
| 2017/0117506 A1* | 4/2017 | Hiraoka | ............... | H05B 33/08 |
| 2017/0222190 A1* | 8/2017 | Kwon | ............... | H01L 27/3211 |
| 2017/0250344 A1* | 8/2017 | Choi | ............... | H01L 27/3246 |
| 2018/0033967 A1* | 2/2018 | Bang | ............... | H01L 27/3246 |
| 2018/0033968 A1* | 2/2018 | Lee | ............... | H01L 27/3246 |
| 2018/0047930 A1* | 2/2018 | Lee | ............... | H01L 51/0018 |
| 2018/0190907 A1* | 7/2018 | Kim | ............... | G03F 7/095 |
| 2019/0173046 A1* | 6/2019 | Jeong | ............... | H01L 51/0011 |
| 2019/0207163 A1* | 7/2019 | Paek | ............... | H01L 27/3246 |
| 2019/0378986 A1* | 12/2019 | Kim | ............... | H01L 51/0016 |

FOREIGN PATENT DOCUMENTS

| | | |
|---|---|---|
| JP | 2008-85200 A | 4/2008 |
| WO | WO 2008/038588 A1 | 4/2008 |

* cited by examiner

ORGANIC LIGHT-EMITTING DISPLAY APPARATUS AND METHOD OF MANUFACTURING THE SAME

CROSS-REFERENCE TO RELATED APPLICATION

Korean Patent Application No. 10-2016-0098043, filed on Aug. 1, 2016, in the Korean Intellectual Property Office, and entitled: "Organic Light-Emitting Display Apparatus and Method of Manufacturing the Same," is incorporated by reference herein in its entirety.

BACKGROUND

1. Field

Embodiments relate to an organic light-emitting display apparatus and a method of manufacturing the same.

2. Description of the Related Art

An organic light-emitting display apparatus may be structured as a self-emitting display apparatus that includes an organic emission layer formed between electrodes. The organic light-emitting display may be driven to emit light when holes injected from one of the electrodes and electrons injected from another of the electrodes recombine in the organic emission layer. The organic light-emitting display apparatus may have advantages such as low power consumption, high luminance, and fast response.

SUMMARY

Embodiments are directed to an organic light-emitting display apparatus, including a substrate; lower electrodes, the lower electrodes being on the substrate and spaced apart from one another; a pixel-defining film, the pixel-defining film having portions that cover ends of the lower electrodes; upper electrodes, an upper electrode corresponding to each lower electrode, each upper electrode including a first portion contacting the corresponding lower electrode and a second portion contacting the pixel-defining film; organic functional layers, each including an emission layer, an organic functional layer corresponding to each upper electrode and disposed thereon; and an electrode on the organic functional layers.

The upper electrodes may include a material with a reducibility that is higher than a reducibility of a material of the lower electrodes.

The lower electrodes may not include silver (Ag).

The upper electrodes may include silver (Ag).

The organic functional layers may each further include at least one functional layer from among a hole injection layer, a hole transport layer, an electron transport layer, and an electron injection layer.

The electrode on the organic functional layers may be integrated across a plurality of the organic functional layers.

The organic light-emitting display apparatus may further include auxiliary electrodes. An auxiliary electrode may correspond to each organic functional layer and disposed thereon, and the auxiliary electrodes may be spaced apart from one another.

The first upper electrodes may be respectively on inclined surfaces of the portions of the pixel-defining film that cover the ends of the first lower electrodes.

Embodiments are also directed to a method of manufacturing an organic light-emitting display apparatus, the method including forming lower electrodes on a substrate, the lower electrodes being spaced apart from one another; forming a pixel-defining film, the pixel-defining film having portions that cover ends of the lower electrodes; forming a first lift-off layer on the lower electrodes and the pixel-defining film; forming a first region corresponding to a first one of the lower electrodes, the first region being formed by removing a first portion of the first lift-off layer; sequentially forming, in the first region, a first upper electrode and a first organic functional layer that includes a first emission layer; removing a second portion of the first lift-off layer using a first solvent; forming a second lift-off layer on the substrate, the second lift-off layer covering the first organic functional layer and the lower electrodes; forming a second region corresponding to a second one of the lower electrodes, the second region being formed by removing a first portion of the second lift-off layer; sequentially forming, in the second region, a second upper electrode and a second functional layer that includes a second emission layer; removing a second portion of the second lift-off layer using a second solvent; and forming a second electrode on the first organic functional layer and the second organic functional layer.

Each of the first and second lift-off layers may include a fluoropolymer.

Each of the first and second lift-off layers may further include a light-sensitive material.

The method may further include forming a first photoresist on the first lift-off layer; and forming a second photoresist on the second lift-off layer.

The first photoresist may be patterned where the first region is, as the first portion of the first lift-off layer is removed, the first lift-off layer may be formed with an undercut profile in the first region, the second photoresist may be patterned where the second region is, and, as the second portion of the second lift-off layer is removed, the second lift-off layer may be formed with an undercut profile.

Each of the first solvent and the second solvent may include fluorine.

The first upper electrode and the first organic functional layer may be formed using a deposition process.

The second upper electrode and the second organic functional layer may be formed using a deposition process.

The first upper electrode may be formed of a material with a reducibility higher than a reducibility of the corresponding lower electrode.

The lower electrodes may not include silver (Ag).

The upper electrodes may include silver (Ag).

The method may further include, before the forming of the second electrode, forming a first auxiliary electrode on the first organic functional layer and forming a second auxiliary electrode on the second organic functional layer, the first and second auxiliary electrodes being spaced apart from each other.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
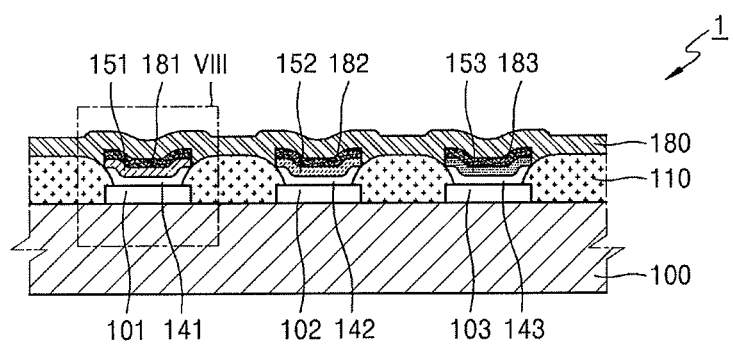
FIG. 1 illustrates a cross-sectional view of an organic light-emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Like reference numerals refer to like elements throughout.

It will be understood that although the terms "first", "second", etc. may be used herein to describe various elements, these elements should not be limited by these terms. These elements are only used to distinguish one element from another.

As used herein, the singular forms "a", "an", and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being "formed on", another layer, region, or element, it can be directly or indirectly formed on the other layer, region, or element. Thus, for example, intervening layers, regions, or elements may be present.

As used herein, the term "and/or" includes any and all combinations of one or more of the associated listed items. Expressions such as "at least one of" when preceding a list of elements, modify the entire list of elements and do not modify the individual elements of the list.

FIG. 1 is a cross-sectional view of an organic light-emitting display apparatus 1 according to an embodiment.

Referring to FIG. 1, in the organic light-emitting display apparatus 1 according to the present example embodiment, a plurality of anode lower electrodes including a first anode lower electrode 101, a second anode lower electrode 102, and a third anode lower electrode 103 are located on a substrate 100 to be spaced apart from one another. A pixel-defining film 110 covers ends of the first through third anode lower electrodes 101, 102, and 103. First through third anode upper electrodes 141, 142, and 143 are respectively located on the first through third anode lower electrodes 101, 102, and 103. First through third organic functional layers 151, 152, and 153 (respectively including first through third emission layers) are respectively located on the first through third anode upper electrodes 141, 142, and 143. First through third auxiliary cathodes 181, 182, and 183 are respectively located on the first through third organic functional layers 151, 152, and 153. An integrated cathode 180 is located as a common electrode on the first through third auxiliary cathodes 181, 182, and 183 and the pixel-defining film 110.

A method of manufacturing the organic light-emitting display apparatus 1 according to the present example embodiment and the organic light-emitting display apparatus 1 manufactured by using the method will now be explained in more detail with reference to FIGS. 2 through 6G.

Figure 2:
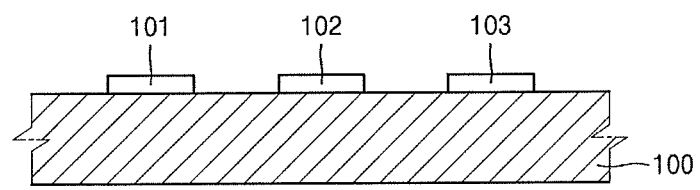
FIG. 2 illustrates a cross-sectional view for explaining an operation of forming a plurality of anodes on a substrate of the organic light-emitting display apparatus of FIG. 1.

FIG. 2 is a cross-sectional view for explaining a method of manufacturing the organic light-emitting display apparatus 1 according to the present example embodiment and the organic light-emitting display apparatus manufactured by using the method will now be explained in more detail with reference to FIGS. 2 through 6G.

Figure 3:
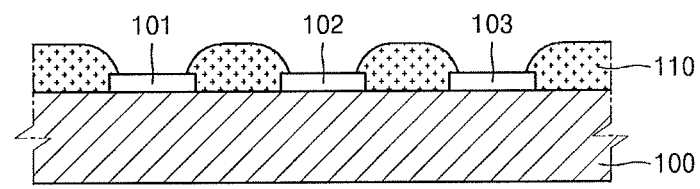
FIG. 3 illustrates a cross-sectional view for explaining an operation of forming a pixel-defining film in the organic light-emitting display apparatus of FIG. 1.

FIG. 2 is a cross-sectional view illustrating the first through third anode lower electrodes 101, 102, and 103 formed on the substrate 100 of the organic light-emitting display apparatus 1 according to the present example embodiment. FIG. 3 is a cross-sectional view illustrating the pixel-defining film 110 formed in the organic light-emitting display apparatus 1 according to the present example embodiment. FIGS. 4A through 4G are cross-sectional views for explaining a first process of the organic light-emitting display apparatus 1 according to the present example embodiment. FIGS. 5A through 5G are cross-sectional views for explaining a second process of the organic light-emitting display apparatus 1 according to the present example embodiment. FIGS. 6A through 6G are cross-sectional views for explaining a third process of the organic light-emitting display apparatus 1 according to the present example embodiment.

Referring to FIG. 2, a plurality of anode lower electrodes, including the first anode lower electrode 101, the second anode lower electrode 102, and the third anode lower electrode 103, is formed on the substrate 100.

The substrate 100 may be formed by using various materials. For example, the substrate 100 may be formed of glass or plastic. Examples of the plastic may include materials having excellent heat resistance and excellent durability such as polyimide, polyethylenenaphthalate, polyethyleneterephthalate, polyarylate, polycarbonate, polyetherimide, and polyethersulfone.

Although not shown in FIG. 2, a buffer layer for planarizing a surface and preventing penetration of impurity elements may be formed over the substrate 100. For example, the buffer layer may have a single-layer structure or a multi-layer structure formed of silicon nitride and/or silicon oxide.

Each of the first through third anode lower electrodes 101, 102, and 103 may be hole injection electrodes and may be formed of, for example, a material having a high work function. Each of the first through third anode lower electrodes 101, 102, and 103 may include, for example, a transparent conductive oxide component. For example, each of the first through third anode lower electrodes 101, 102, and 103 may include at least one selected from the group of indium tin oxide, indium zinc oxide, zinc oxide, indium oxide, indium gallium oxide, and aluminum zinc oxide. Each of the first through third anode lower electrodes 101, 102, and 103 may include a metal component such as aluminum, magnesium, lithium, or calcium. In the present example embodiment, each of the first through third anode lower electrodes 101, 102, and 103 does not include a silver (Ag) component that is a metal with a high reducibility. Since each of the first through third anode lower electrodes 101, 102, and 103 does not include a silver component, particle defects due to re-precipitation of silver may be avoided, which will be explained below in detail.

Although not shown in FIG. 2, the first through third anode lower electrodes 101, 102, and 103 may be respectively electrically connected to first through third thin-film transistors located between the substrate 100 and the first through third anode lower electrodes 101, 102, and 103.

Referring to FIG. 3, the pixel-defining film 110 surrounding edges of the first anode lower electrode 101, the second anode lower electrode 102, and the third anode lower electrode 103 is formed on the substrate 100.

Ends of the first through third anode lower electrodes 101, 102, and 103 may be sharp. Thus, when the cathode 180 is formed and current is applied, an electric field may concentrate on the ends of the first through third anode lower electrodes 101, 102, and 103 and an electrical short circuit may occur during operation. In the present example embodiment, the first through third organic functional layers 151, 152, and 153 cover the ends of the first through third anode lower electrodes 101, 102, and 103 and a pixel-defining film 110 also covers the ends of the first through third anode lower electrodes 101, 102, and 103. Thus, an electric field may be prevented from concentrating at the ends of the first through third anode lower electrodes 101, 102, and 103.

The pixel-defining film 110 may be an organic insulating film including, for example, a general-purpose polymer such as poly(methyl methacrylate) (PMMA) or polystyrene (PS), a polymer derivative having a phenol group, an acryl-based polymer, an imide-based polymer, an arylether-based polymer, an amide-based polymer, a fluorine-based polymer, a p-xylene-based polymer, a vinyl alcohol-based polymer, and a blend thereof.

Figure 4A:
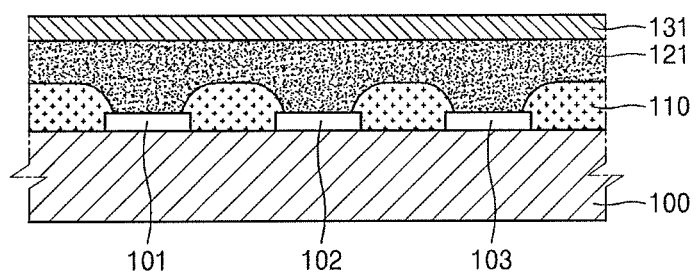
FIGS. 4A through 4G illustrate cross-sectional views for explaining a first process of the organic light-emitting display apparatus of FIG. 1.

Referring to FIG. 4A, a first lift-off layer 121 and a first photoresist 131 each including a fluoropolymer are sequentially formed on the substrate 100 on which the first through third anode lower electrodes 101, 102, and 103 are formed.

The fluoropolymer included in the first lift-off layer 121 may include, for example, a polymer having a fluorine content ranging from about 20 wt % to about 60 wt %. For example, the fluoropolymer included in the first lift-off layer 121 may include at least one from among a copolymer of polytetrafluoroethylene, polychlorotrifluoroethylene, polydichlorodifluoroethylene, chlorotrifluoroethylene, and dichlorofluoroethylene, a copolymer of tetrafluoroethylene and perfluoroalkylvinylether, a copolymer of chlorotrifluoroethylene and perfluoroalkylvinylether, a copolymer of tetrafluoroethylene and perfluoroalkylvinylether, and a copolymer of chlorotrifluoroethylene and perfluoroalkylvinylether.

The first lift-off layer 121 may be formed on the substrate 100 by using, for example, a coating method, a printing method, or a deposition method. When the first lift-off layer 121 is formed by using a coating method and a printing method, curing and polymerization may be performed and then a process of forming a photoresist may be performed.

A thickness of the first lift-off layer 121 may be, for example, equal to or greater than 0.2 μm and equal to or less than 5 μm. When the first lift-off layer 121 is thicker, a time taken to dissolve the first lift-off layer 121 for patterning may be increased and thus a manufacturing process time may be increased. When the first lift-off layer 121 is thinner, it may be difficult to perform a lift-off process.

The first lift-off layer 121 may further include a moisture-absorbing agent. The moisture-absorbing agent may include various materials. The moisture-absorbing agent may include a material that is a compound in which metals are connected by oxygen such as calcium oxide, barium oxide, aluminum oxide, or magnesium oxide and that forms metal hydroxide by reacting with water. Also, the moisture-absorbing agent may include any one selected from the group of a metal halide, an inorganic acid salt of a metal, an organic acid salt, a porous inorganic compound, and a combination thereof. The moisture-absorbing agent may include an acryl-based organic material, a methacryl-based organic material, a polyisoprene-based organic material, a vinyl-based organic material, an epoxy-based organic material, a urethane-based organic material, or a cellulose-based organic material. The moisture-absorbing agent may include a titania-based inorganic material, a silicon oxide-based inorganic material, a zirconia-based inorganic material, or an alumina-based inorganic material. The moisture-absorbing agent may include a sealant formed of epoxy silane, vinyl silane, amine silane, or methacrylate silane. The moisture-absorbing agent may trap moisture generated during a first process and may prevent degradation of the first organic functional layer 151 formed in the first process.

The first photoresist 131 is formed on the first lift-off layer 121. The first photoresist 131 may be exposed and developed by using a first photomask. The first photoresist 131 may be a positive photoresist or a negative photoresist. In the present example embodiment, it is assumed that the first photoresist 131 is a positive photoresist.

Figure 4B:
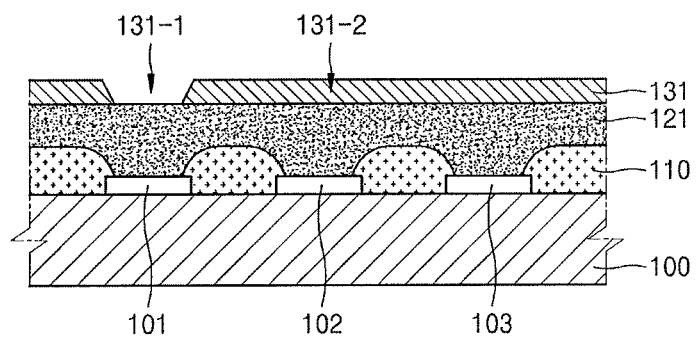

Referring to FIG. 4B, the first photoresist 131 is patterned. The first photoresist 131 that is exposed and developed is removed at a first portion 131-1 corresponding to the first anode lower electrode 101 and remains at a second portion 131-2 other than the first portion 131-1.

Figure 4C:
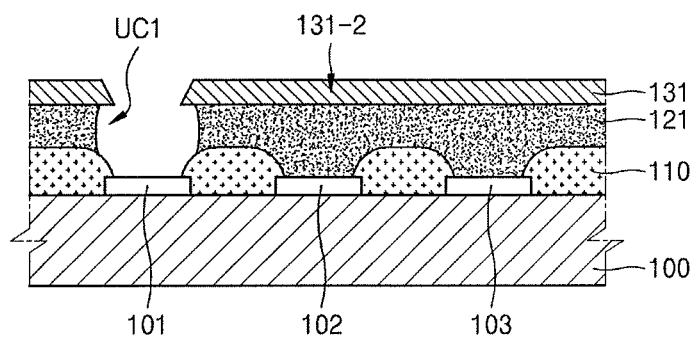

Referring to FIG. 4C, the first lift-off layer 121 is etched by using a pattern of the first photoresist 131 of FIG. 4B as an etch mask.

When the first lift-off layer 121 includes the fluoropolymer, the etchant may include a solvent to etch the fluoropolymer.

The etchant may include a first solvent including fluorine. The first solvent may include hydrofluoroether. Hydrofluoroether is a material that is electrochemically stable due to a low interaction with other materials and is environmentally stable due to a low global warming potential and a low toxicity.

A portion of the first lift-off layer 121 formed over the first anode lower electrode 101 to correspond to the first portion 131-1 is etched during an etching process. The first lift-off layer 121 may be etched to form a first undercut profile UC1 under a boundary surface of the first portion 131-1 of the first photoresist 131 and to be spaced apart by a predetermined interval from a side surface of the first anode lower electrode 101. The first undercut profile UC1 may allow the first anode upper electrode 141 to cover an inclined surface that is an end of the pixel-defining film 110 in a subsequent deposition process.

Figure 4D:
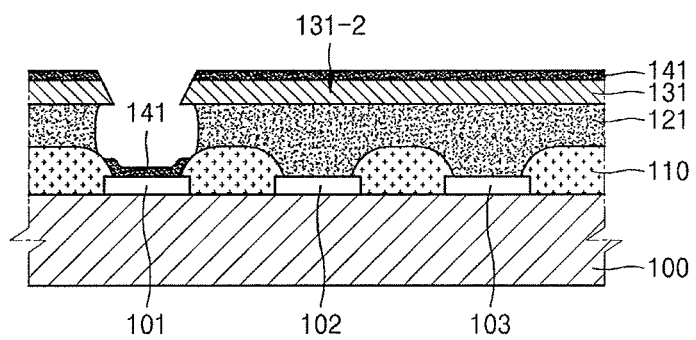

Referring to FIG. 4D, the first anode upper electrode 141 is formed on a structure of FIG. 4C. The first anode upper electrode 141 may include various metals. The first anode upper electrode 141 may include, for example, a material with a reducibility higher than a material of the first anode lower electrode 101. For example, the first anode upper electrode 141 may include silver with a high reducibility.

Silver that is a metal with a high reflectance may be used as a material of a reflective electrode of a display apparatus. For example, in a top-emission display apparatus in which light is emitted away from the substrate 100, an electrode close to the substrate 100 may be a reflective electrode. When the first anode lower electrode 101 is formed of a material including silver with a high reducibility, silver ions receiving electrons in an etching process for forming a pattern of the first anode lower electrode 101 may be re-precipitated to form particles, thereby leading to defects.

In the present example embodiment, the first anode lower electrode 101 does not include a silver component and the first anode upper electrode 141 includes a silver component. Thus, particle defects of a display apparatus may be reduced, a reflectance may be increased, and light efficiency may be improved.

The first anode lower electrode 101 may be subjected to an etching process in order to form a pattern. However, the first anode upper electrode 141 of the present example embodiment may be formed by using a vacuum deposition method without undergoing an etching process. Thus, a part of the first anode upper electrode 141 may be deposited to directly contact a top surface of the first anode lower electrode 101 and a part of the first anode upper electrode 141 may be deposited to contact the inclined surface that is the end of the pixel-defining film 110, by using the first lift-off layer 121 and the first photoresist 131 as masks. Accordingly, an emission area may be increased and defects due to a residue generated in a subsequent lift-off process may be reduced.

Figure 4E:
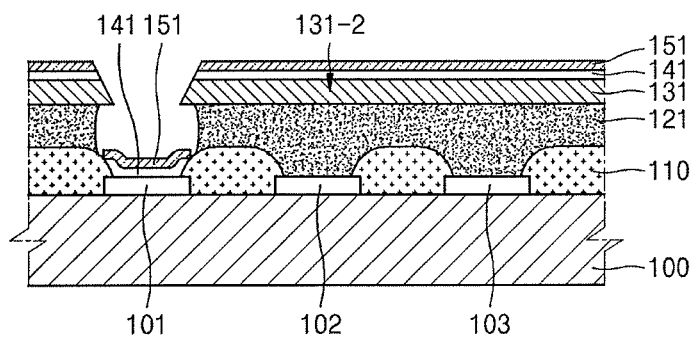

Referring to FIG. 4E, the first organic functional layer 151 is formed on a structure of FIG. 4D.

The first organic functional layer 151 includes a first organic emission layer. Also, the first organic functional layer 151 may further include at least one functional layer from among a hole injection layer, a hole transport layer, an electron transport layer, and an electron injection layer.

The first organic functional layer 151 may be formed by using a vacuum deposition method, like the first anode upper electrode 141. In a deposition process, the first lift-off layer 121 and the first photoresist 131 function as deposition masks. A part of the first organic functional layer 151 is formed to cover a top surface of the first anode upper electrode 141 and another part of the first organic functional layer 151 is formed on the second portion 131-2 of the first photoresist 131.

Figure 4F:
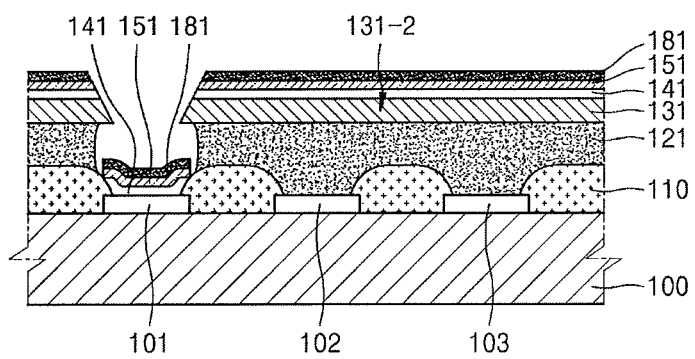

In an example embodiment, referring to FIG. 4F, the first auxiliary cathode 181 is formed on a structure of FIG. 4E.

The first auxiliary cathode 181 may be formed by using, for example, a vacuum deposition method, e.g., like the first anode upper electrode 141 and the first organic functional layer 151. In a deposition process, the first lift-off layer 121 and the first photoresist 131 may function as deposition masks. A part of the first auxiliary cathode 181 is formed to cover a top surface of the first organic functional layer 151 and another part of the first auxiliary cathode 181 is formed on the second portion 131-2 of the first photoresist 131 other than the first portion 131-1.

The first auxiliary cathode 181 may include the same material as that of the cathode 180 that is a common electrode. In another implementation, the first auxiliary cathode 181 may be formed of a material different from that of the cathode 180. The first auxiliary cathode 181 may function as a barrier for protecting the first organic functional layer 151 from a solvent used in a subsequent lift-off process.

Figure 4G:
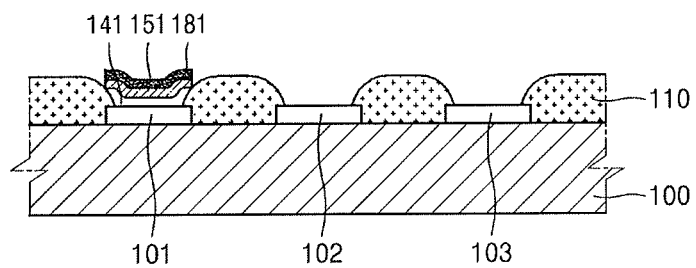

Referring to FIG. 4G, a lift-off process is performed on a structure of FIG. 4F.

The first lift-off layer 121 may include the fluoropolymer, and a second solvent including fluorine may be used in the lift-off process. The first organic functional layer 151 may be formed and then the lift-off process may be performed. Thus, the second solvent may include a material having a low reactivity with the first organic functional layer 151. The second solvent may include, for example, hydrofluoroether, like the first solvent.

When the first lift-off layer 121 formed under the second portion 131-2 of the first photoresist 131 is lifted off, portions of the first anode upper electrode 141, the first organic functional layer 151, and the first auxiliary cathode 181 formed over the second portion 131-2 of the first photoresist 131 are removed, and portions of the first anode upper electrode 141, the first organic functional layer 151, and the first auxiliary cathode 181 formed over the first anode lower electrode 101 remain as patterns.

After the first process is performed, a second process of forming the second organic functional layer 152 (see FIG. 5G) (which may emit light of a color different from that of the first organic functional layer 151) may be performed on an area where the second anode lower electrode 102 is located.

The second process will now be explained with reference to FIGS. 5A through 5G.

Figure 5A:
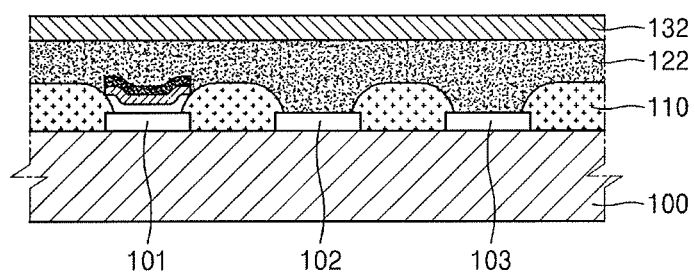
FIGS. 5A through 5G illustrate cross-sectional views for explaining a second process of the organic light-emitting display apparatus of FIG. 1.

Referring to FIG. 5A, a second lift-off layer 122 and a second photoresist 132, which may each include a fluoropolymer, are sequentially formed on the substrate 100 on which the first through third anode lower electrodes 101, 102, and 103 and the first organic functional layer 151 are formed.

The second lift-off layer 122 may be formed by using, for example, a coating method, a printing method, or a deposition method. The second lift-off layer 122 may be formed of the same material as that of the first lift-off layer 121.

The second photoresist 132 may be exposed and developed by using a second photomask. The second photoresist 132 may be, for example, a positive photoresist or a negative photoresist. In the present example embodiment, the second photoresist is described as a positive photoresist.

Figure 5B:
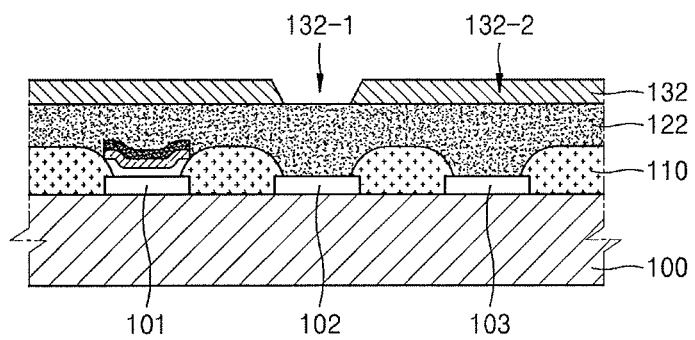

Referring to FIG. 5B, the second photoresist 132 is patterned. The second photoresist 132 that is exposed and developed is removed at a first portion 132-1 corresponding to the second anode lower electrode 102 and remains at a second portion 132-2 other than the first portion 132-1.

Figure 5C:
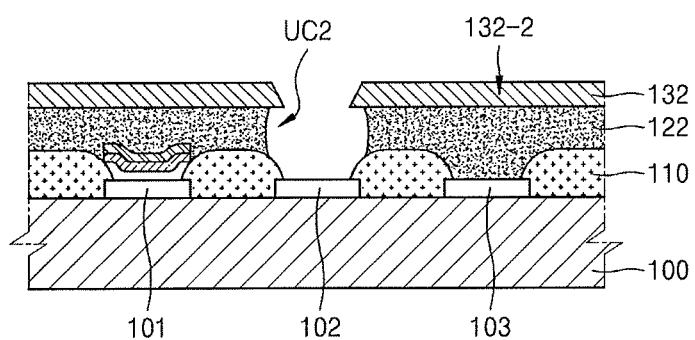

Referring to FIG. 5C, the second lift-off layer 122 is etched by using a pattern of the second photoresist 132 of FIG. 5B as an etch mask.

The second lift-off layer 122 may includes the fluoropolymer, and the etchant may include a solvent that may etch the fluoropolymer.

The etchant may include a first solvent including fluorine. The first solvent may include hydrofluoroether, like in the first process. The first solvent may include a material different from that in the first process.

A portion of the second lift-off layer 122 formed over the second anode lower electrode 102 to correspond to the first portion 132-1 is etched during an etching process. The second lift-off layer 122 may be etched to form a second undercut profile UC2 under a boundary surface of the first portion 132-1 of the second photoresist 132 and to be spaced apart by a predetermined interval from a side surface of the second anode lower electrode 102. The second undercut profile UC2 may allow the second anode upper electrode 142 to cover an inclined surface that is an end of the pixel-defining film 110 in a subsequent deposition process.

Figure 5D:
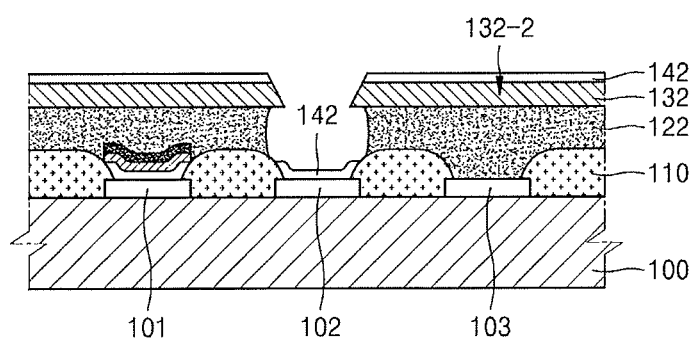

Referring to FIG. 5D, the second anode upper electrode 142 is formed on a structure of FIG. 5C. The second anode upper electrode 142 may include, for example, various metals. The second anode upper electrode 142 may include a material that is the same as or different from that of the first anode upper electrode 141. The second anode upper electrode 142 may include a material with a reducibility higher than that of the second anode lower electrode 102. For example, the second anode upper electrode 142 may include silver with a high reducibility.

A part of the second anode upper electrode 142 may be deposited to directly contact a top surface of the second anode lower electrode 102, and a part of the second anode upper electrode 142 may be deposited to contact the inclined surface that is the end of the pixel-defining film 110, using the second lift-off layer 122 and the second photoresist 132 as masks. Accordingly, an emission area may be increased and defects due to a residue generated in a subsequent lift-off process may be reduced.

Figure 5E:
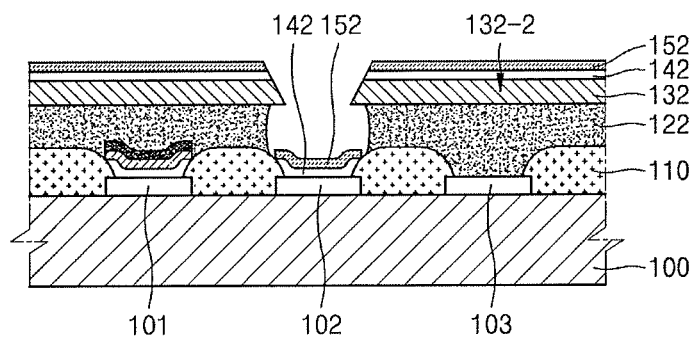

Referring to FIG. 5E, the second organic functional layer 152 is formed on a structure of FIG. 5D.

The second organic functional layer 152 includes a second organic emission layer. Also, the second organic functional layer 152 may further include at least one functional layer from among a hole injection layer, a hole transport layer, an electron transport layer, and an electron injection layer.

The second organic functional layer 152 may be formed by using, for example, a vacuum deposition method, like the second anode upper electrode 142. In a deposition process, the second lift-off layer 122 and the second photoresist 132 may function as deposition masks. A part of the second organic functional layer 152 is formed to cover a top surface of the second anode upper electrode 142 and another part of the second organic functional layer 152 is formed on the second portion 132-2 of the second photoresist 132.

Figure 5F:
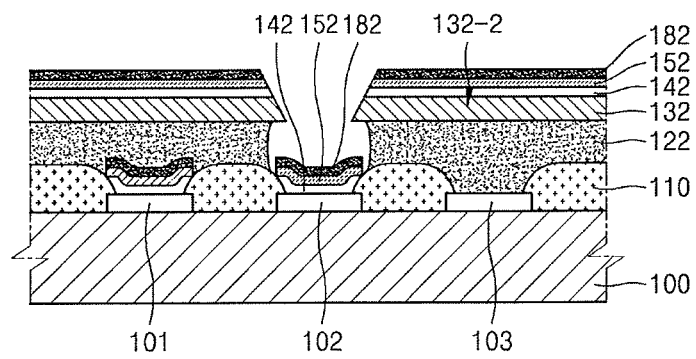

Referring to FIG. 5F, the second auxiliary cathode 182 is formed on a structure of FIG. 5E.

The second auxiliary cathode 182 may be formed by using, for example, a vacuum deposition method, like the second anode upper electrode 142 and the second organic functional layer 152. In a deposition process, the second lift-off layer 122 and the second photoresist 132 may function as deposition masks. A part of the second auxiliary cathode 182 is formed to cover a top surface of the second organic functional layer 152 and another part of the second auxiliary cathode 182 is formed on the second portion 132-2 of the second photoresist 132 other than the first portion 132-1.

The second auxiliary cathode 182 may include a material that is the same as or different from that of the first auxiliary cathode 181. The second auxiliary cathode 182 may include the same material as that of the cathode 180 that is a common electrode. In another implementation, the second auxiliary cathode 182 may be formed of a material different from that of the cathode 180. The second auxiliary cathode 182 may function as a barrier for protecting the second organic functional layer 152 from a solvent used in a subsequent lift-off process.

Figure 5G:
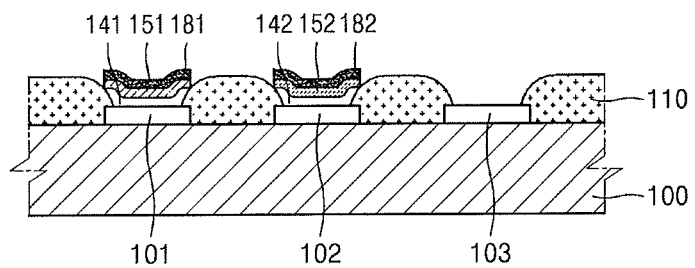

Referring to FIG. 5G, a lift-off process is performed on a structure of FIG. 5F.

The second lift-off layer 122 may include the fluoropolymer, and a second solvent including fluorine may be used in the lift-off process. Since the second organic functional layer 152 may be formed and then the lift-off process may be performed, the second solvent may include a material having a low reactivity with the second organic functional layer 152. The second solvent may include, for example, hydrofluoroether, like the first solvent.

When the second lift-off layer 122 formed under the second portion 132-2 of the second photoresist 132 is lifted off, portions of the second anode upper electrode 142, the second organic functional layer 152, and the second auxiliary cathode 182 formed over the second portion 132-2 of the second photoresist 132 are removed, and portions of the second anode upper electrode 142, the second organic functional layer 152, and the second auxiliary cathode 182 formed over the second anode lower electrode 102 remain as patterns.

After the second process is performed, a third process of forming the third organic functional layer 153 (see FIG. 6G) (which may emit light of a color different from those of the first organic functional layer 151 and the second organic functional layer 152) may be performed on an area where the third anode lower electrode 103 is located.

The third process will now be explained with reference to FIGS. 6A through 6G.

Figure 6A:
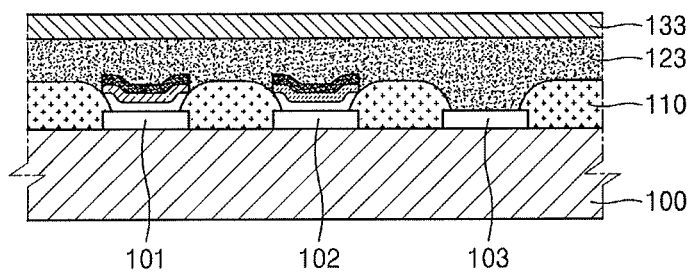
FIGS. 6A through 6G illustrate cross-sectional views for explaining a third process of the organic light-emitting display apparatus of FIG. 1.

Referring to FIG. 6A, a third lift-off layer 123 and a third photoresist 333, which may each include a fluoropolymer, are sequentially formed on the substrate 100 on which the first through third anode lower electrodes 101, 102, and 103 and the first and second organic functional layers 151 and 152 are formed.

The third lift-off layer 123 may be formed by using, for example, a coating method, a printing method, and a deposition method. The third lift-off layer 123 may be formed of the same material as those/that of the first and/or the second lift-off layers 121 and 122.

The third photoresist 133 may be exposed and developed by using a third photomask. The third photoresist 133 may be a positive photoresist or a negative photoresist. In the present example embodiment, the third photoresist is described as a positive photoresist.

Figure 6B:
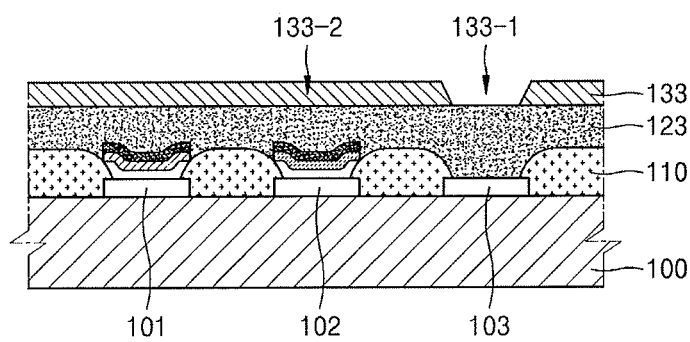

Referring to FIG. 6B, the third photoresist 133 is patterned. The third photoresist 133 is exposed and developed to be removed at a first portion 133-1 corresponding to the third anode lower electrode 103 and to remain at a second portion 133-2 other than the first portion 133-1.

Figure 6C:
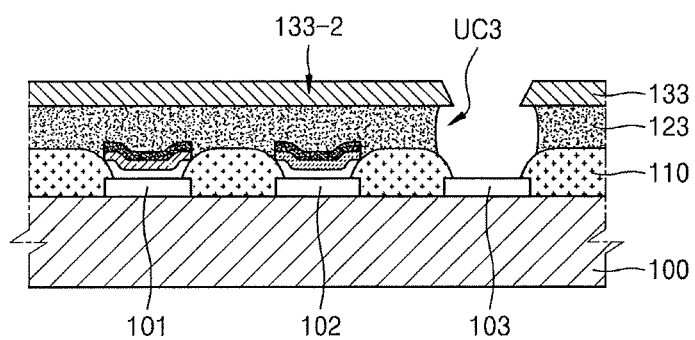

Referring to FIG. 6C, the third lift-off layer 123 may be etched by using a pattern of the third photoresist 133 of FIG. 6B as an etch mask.

The third lift-off layer 123 may include the fluoropolymer, and the etchant may include a solvent that etches the fluoropolymer.

The etchant may include a first solvent including fluorine. The first solvent may include, for example, hydrofluoroether, like in the first and second processes. The first solvent may include a material different from that in the first and second processes.

A portion of the third lift-off layer 123 formed over the third anode lower electrode 103 to correspond to the first portion 133-1 is etched during an etching process. The third lift-off layer 123 may be etched to form a third undercut profile UC3 under a boundary surface of the first portion 133-1 of the third photoresist 133 and to be spaced apart by a predetermined interval from a side surface of the third anode lower electrode 103. The third undercut profile UC3 may allow the third anode upper electrode 143 to cover an inclined surface that is an end of the pixel-defining film 110 in a subsequent deposition process.

Figure 6D:
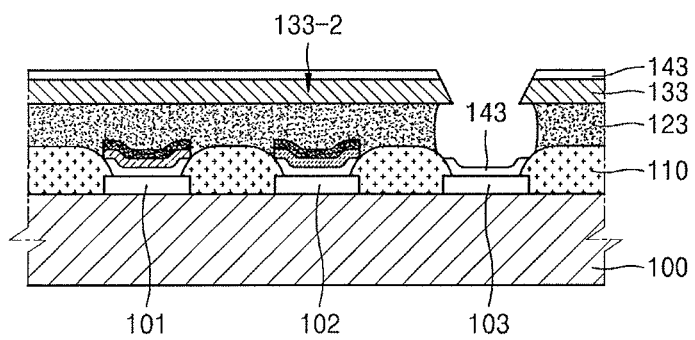

Referring to FIG. 6D, the third anode upper electrode 143 is formed on a structure of FIG. 6C. The third anode upper electrode 143 may include various metals. The third anode upper electrode 143 may include a material that is the same as or different from those of the first and second anode upper electrodes 141 and 142. The third anode upper electrode 143 may include a material with a reducibility higher than that of the third anode lower electrode 103. For example, the third anode upper electrode 143 may include silver with a high reducibility.

A part of the third anode upper electrode 143 may be deposited to directly contact a top surface of the third anode lower electrode 103 and a part of the third anode upper electrode 143 may be deposited to contact the inclined surface that is the end of the pixel-defining film 110, using the third lift-off layer 123 and the third photoresist 133 as masks. Accordingly, an emission area may be increased and defects due to a residue generated in a subsequent lift-off process may be reduced.

Figure 6E:
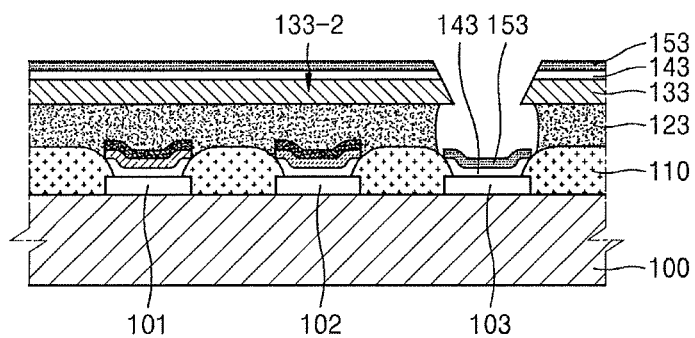

Referring to FIG. 6E, the third organic functional layer 153 is formed on a structure of FIG. 6D.

The third organic functional layer 153 includes a third organic emission layer. Also, the third organic functional layer 153 may further include at least one functional layer from among a hole injection layer, a hole transport layer, an electron transport layer, and an electron injection layer.

The third organic functional layer 153 may be formed by using, for example, a vacuum deposition process, like the third anode upper electrode 143. In a deposition process, the third lift-off layer 123 and the third photoresist 133 function as deposition masks. A part of the third organic functional layer 153 is formed to cover a top surface of the third anode upper electrode 143 and another part of the third organic functional layer 153 is formed on the second portion 133-2 of the third photoresist 133.

Figure 6F:
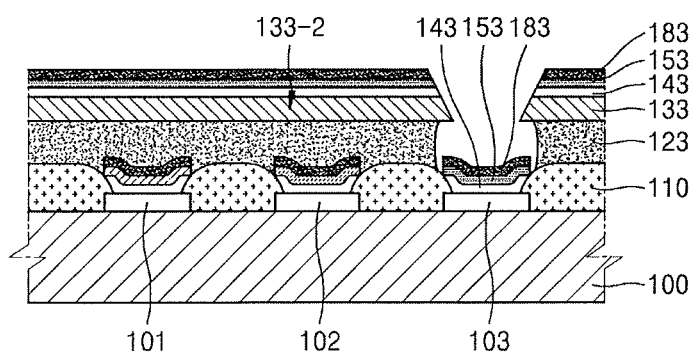

Referring to FIG. 6F, the third auxiliary cathode 183 is formed on a structure of FIG. 6E.

The third auxiliary cathode 183 may be formed by using, for example, a vacuum deposition method, like the third anode upper electrode 143 and the third organic functional layer 153. In a deposition process, the third lift-off layer 123 and the third photoresist 133 function as deposition masks. A part of the third auxiliary cathode 183 is formed to cover a top surface of the third organic functional layer 153 and another part of the third auxiliary cathode 183 is formed on the second portion 133-2 of the third photoresist 133 other than the first portion 133-1.

The third auxiliary cathode 183 may include a material that is the same as or different from those of the first and second auxiliary cathodes 181 and 182. The third auxiliary cathode 183 may include the same material as that of the cathode 180 that is a common electrode. Alternatively, the third auxiliary cathode 183 may be formed of a material different from that of the cathode 180. The third auxiliary cathode 183 may function as a barrier for protecting the third organic functional layer 153 from a solvent used in a subsequent lift-off process.

Figure 6G:
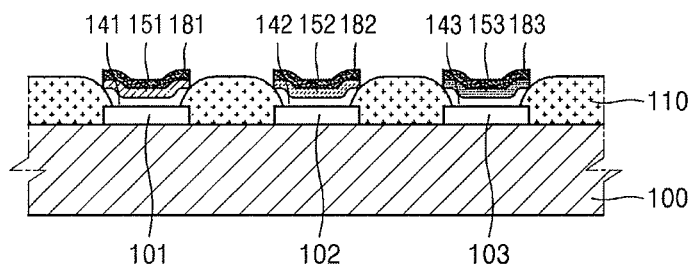

Referring to FIG. 6G, a lift-off process is performed on a structure of FIG. 6F.

The third lift-off layer 123 may include the fluoropolymer, and a second solvent including fluorine may be used in the lift-off process. Since the third organic functional layer 153 may be formed and then the lift-off process may be performed, the second solvent may include a material having a low reactivity with the third organic functional layer 153. The second solvent may include, for example, hydrofluoroether, like the first solvent.

When the third lift-off layer 123 formed under the second portion 133-2 of the third photoresist 133 is lifted off, portions of the third anode upper electrode 143, the third organic functional layer 153, and the third auxiliary cathode 183 formed over the second portion 133-2 of the third photoresist 133 are removed and the third anode upper electrode 143, the third organic functional layer 153, and portions of the third auxiliary cathode 183 formed over the third anode lower electrode 103 remain as patterns.

The first through third organic functional layers 151, 152, and 153 may emit light of different colors. White light may be formed by mixing light emitted from the first through third organic functional layers 151, 152, and 153. For example, the first through third organic functional layers 151, 152, and 153 may respectively emit red light, green light, and blue light. For example, the first through third organic functional layers 151, 152, and 153 may correspond to subpixels constituting a unit pixel of the organic light-emitting display apparatus 1.

Also, the organic light-emitting display apparatus 1 of FIG. 1 may include one unit pixel. Also, the present example embodiment may be applied to an organic light-emitting display apparatus including a plurality of the unit pixels of FIG. 1. Thus, in the first process, a plurality of the first organic functional layers 151 that emit light of a first color may be simultaneously formed. In the second process, a plurality of the second organic functional layers 152 that emit light of a second color may be simultaneously formed. In the third process, a plurality of the third organic functional layers 153 that emit light of a third color may be simultaneously formed. Light of full colors may be formed by using the first through third processes.

Referring back to FIG. 1, the cathode 180 is formed on a structure of FIG. 6G. The cathode 180 may be integrally formed as a common electrode on the first through third organic functional layers 151, 152, and 153 and the pixel-defining film 110.

Although the first through third anode lower electrodes 101, 102, and 103 and the first through third anode upper electrodes 141, 142, and 143 are hole injection electrodes and the first through third auxiliary cathodes 181, 182, and 183 and the cathode 180 are electron injection electrodes in the present example embodiment, the present disclosure is not limited thereto and electron injection electrodes may be formed on an area where the first through third anode lower electrodes 101, 102, and 103 and the first through third anode upper electrodes 141, 142, and 143 are located and hole injection electrodes may be formed on an area where the first through third auxiliary cathodes 181, 182, and 183, and the cathode 180 are located.

In a general process of depositing an organic functional layer by using a metal mask having an opening, it may be difficult to apply the metal mask to an ultra-high resolution panel due to a difficulty in precision processing, for example, due to a thickness and alignment tolerance, and it may be difficult to increase a size of the metal mask due to warping due to a weight of a metal. According to the present disclosure, patterns of the first through third organic functional layers 151, 152, and 153 may be formed by using first through third lift-off processes. Thus, issues relating to the use of the metal mask may be avoided.

FIGS. 7A through 7D are cross-sectional views for explaining some processes of an organic light-emitting display apparatus 2 according to a comparative example.

Figure 7A:
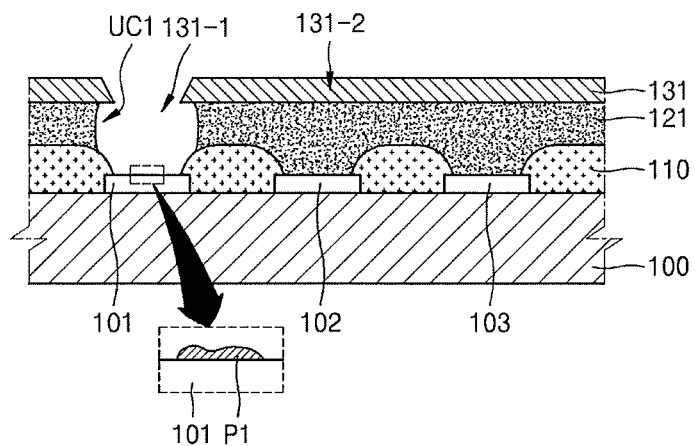
FIGS. 7A through 7D illustrate cross-sectional views for explaining some processes of an organic light-emitting display apparatus according to a comparative example.

Referring to FIG. 7A, the pixel-defining film 110 that covers ends of the first through third anode lower electrodes 101, 102, and 103 formed on the substrate 100 to be spaced apart from one another is formed. The first lift-off layer 121 and the first photoresist 131 are sequentially stacked, and the first photoresist 131 is patterned through exposure and development. The first photoresist 131 is removed at the first portion 131-1 corresponding to the first anode lower electrode 101 and remains at the second portion 131-2 other than the first portion 131-1.

The first undercut profile UC1 is formed under a boundary surface of the first portion 131-1 of the first photoresist 131 by etching the first lift-off layer 121 by using a pattern of the first photoresist 131 as an etch mask. A portion of the first lift-off layer 121 formed over the first anode lower electrode 101 to correspond to the first portion 131-1 is etched. The first lift-off layer 121 including a fluoropolymer may not be completely removed and a residue P1 may remain on the first anode lower electrode 101 as shown in FIG. 7A.

Figure 7B:
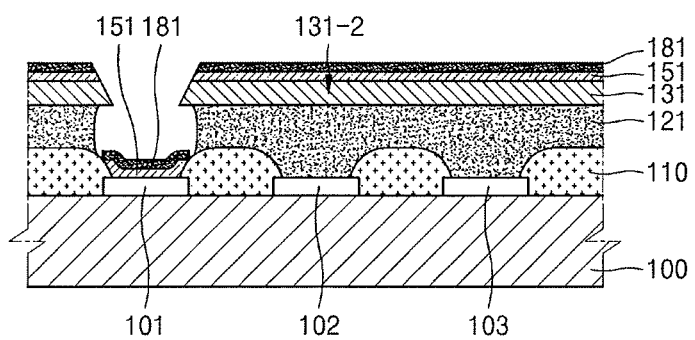

Referring to FIG. 7B, the first organic functional layer 151 and the first auxiliary cathode 181 are deposited on a structure of FIG. 7A.

Figure 7C:
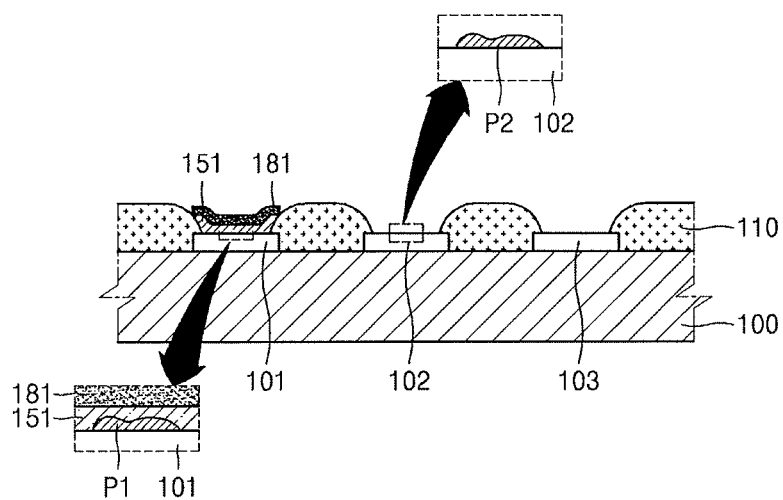

Referring to FIG. 7C, a lift-off process is performed on a structure of FIG. 7B. In this case, the first lift-off layer 121 including the fluoropolymer may not be completely removed and a residue P2 may remain on the second anode lower electrode 102 as shown in FIG. 7C.

The residue P1 on the first anode lower electrode 101 and the residue P2 on the second anode lower electrode 102 may degrade hole or electron injection characteristics from an electrode to an organic functional layer.

However, according to the an example embodiment, in a lift-off process, the first through third anode upper electrodes 141, 142, and 143 may be formed by using a deposition process using a lift-off layer on the first through third anode lower electrodes 101, 102, and 103. Thus, even when residues remain on the first through third anode lower electrodes 101, 102, and 103, the residues may not directly contact the first through third organic functional layers 151, 152, and 153. Accordingly, according to an example embodiment, defects due to a residue generated in a lift-off process may be reduced.

Figure 7D:
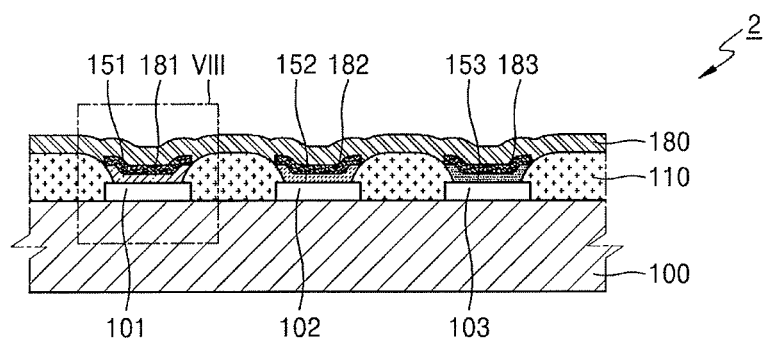

FIG. 7D is a cross-sectional view of the organic light-emitting display apparatus 2 according to the comparative example after first through third processes are completed.

Figure 8:
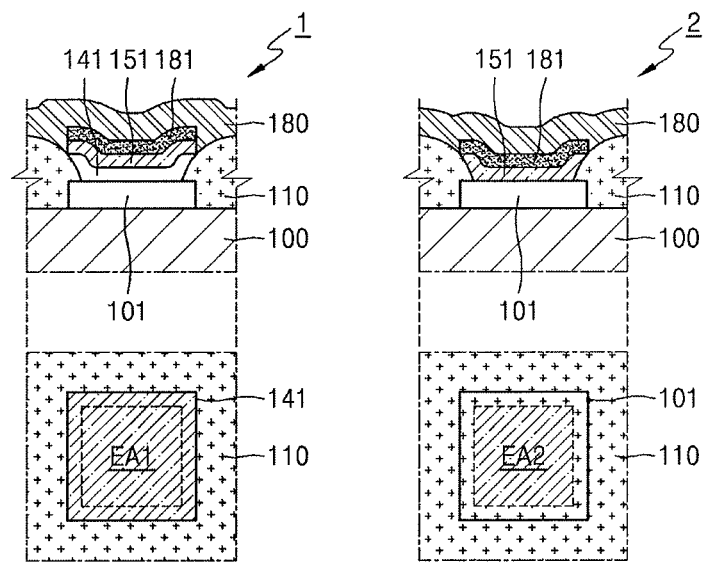
FIG. 8 illustrates a view for comparing sizes of emission areas of the organic light-emitting display apparatus of FIG. 1 and the organic light-emitting display apparatus according to the comparative example.

FIG. 8 is a view for comparing sizes of emission areas of the organic light-emitting display apparatus 1 according to the present example embodiment and the organic light-emitting display apparatus 2 according to the comparative example.

Referring to FIG. 8, in the organic light-emitting display apparatus 2 according to the comparative example, since the pixel-defining film 110 covers an end of the first anode lower electrode 101 and then the first organic functional layer 151 is formed, an emission area EA2 is defined as a portion of the first anode lower electrode 101 that is not covered by the pixel-defining film 110.

However, in the organic light-emitting display apparatus 1 according to the present example embodiment, the first anode upper electrode 141 is formed on a top surface of the first anode lower electrode 101 and on an inclined surface that is an end of the pixel-defining film 110 and then the first organic functional layer 151 is formed on the first anode upper electrode 141. Thus, an emission area EA1 is greater than the emission area EA2 of the comparative example. Accordingly, an aperture ratio of a display apparatus may be increased.

Figure 9:
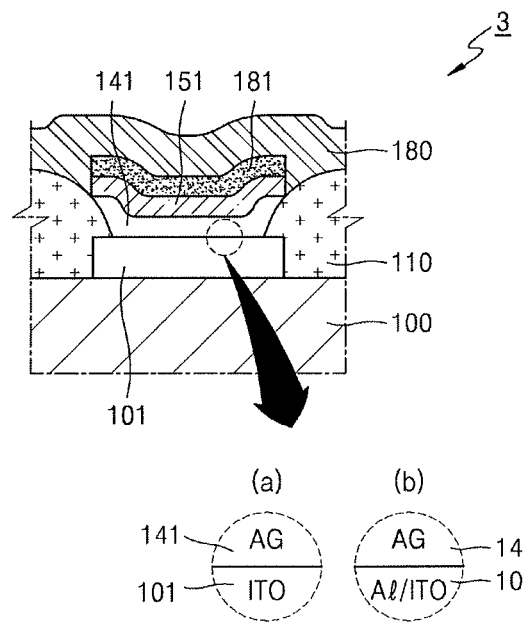
FIG. 9 illustrates a cross-sectional view of an organic light-emitting display apparatus according to another embodiment.

FIG. 9 is a cross-sectional view of an organic light-emitting display apparatus 3 according to another example embodiment.

The organic light-emitting display apparatus 3 of FIG. 9 is different from the organic light-emitting display apparatus 1 in that specific materials are selected as materials of the first anode lower electrode 103 and the first anode upper electrode 141.

In a case A of FIG. 9, the first anode lower electrode 103 is formed of indium tin oxide and the first anode upper electrode 141 is formed of silver. In a case B of FIG. 9, the first anode lower electrode 103 has a stacked structure formed of aluminum (Al) and indium tin oxide, and the first anode upper electrode 141 is formed of silver Ag.

Silver is a metal with a high reducibility. Thus, when the silver is used as a material of the first anode lower electrode 101, silver ions receiving electrons in an etching process for forming a pattern of the first anode lower electrode 101 may be re-precipitated to form particles, thereby leading to defects.

Figure 11A:
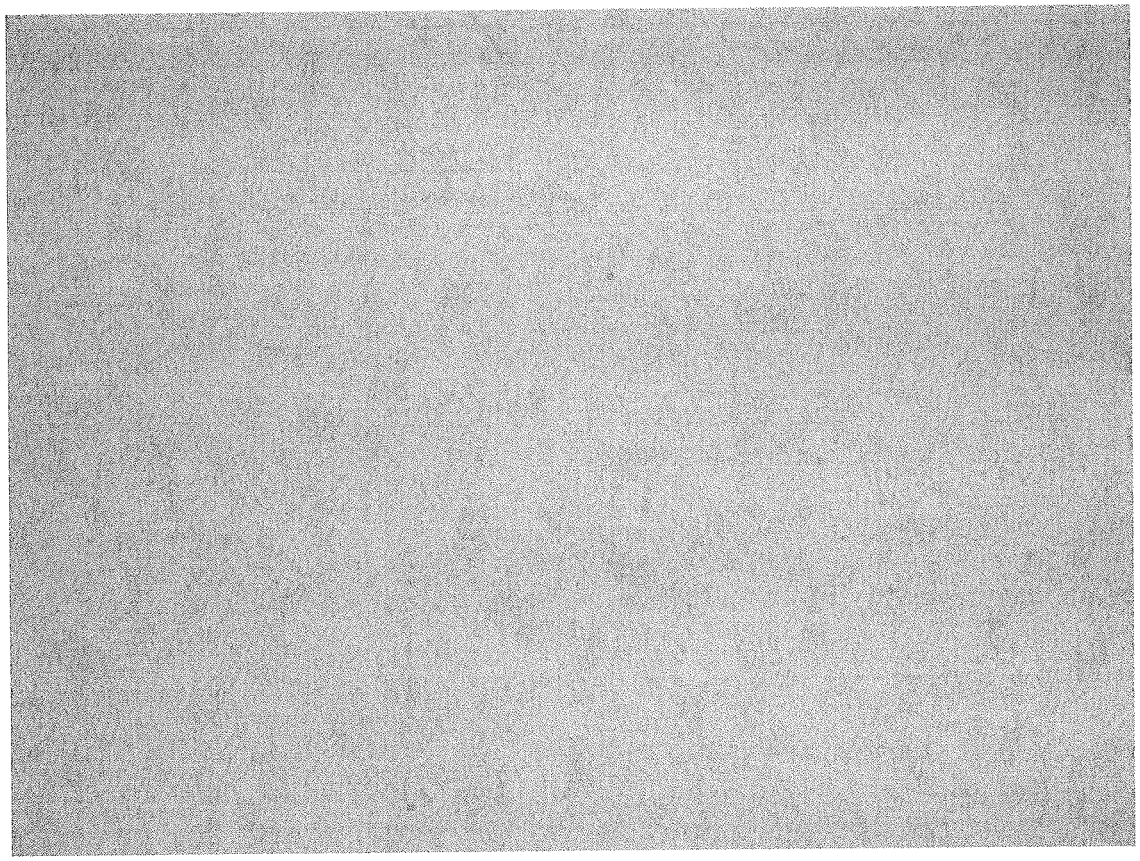
FIGS. 11A and 11B illustrate views illustrating particle defect patterns according to whether a first anode lower electrode includes silver.
Figure 11B:
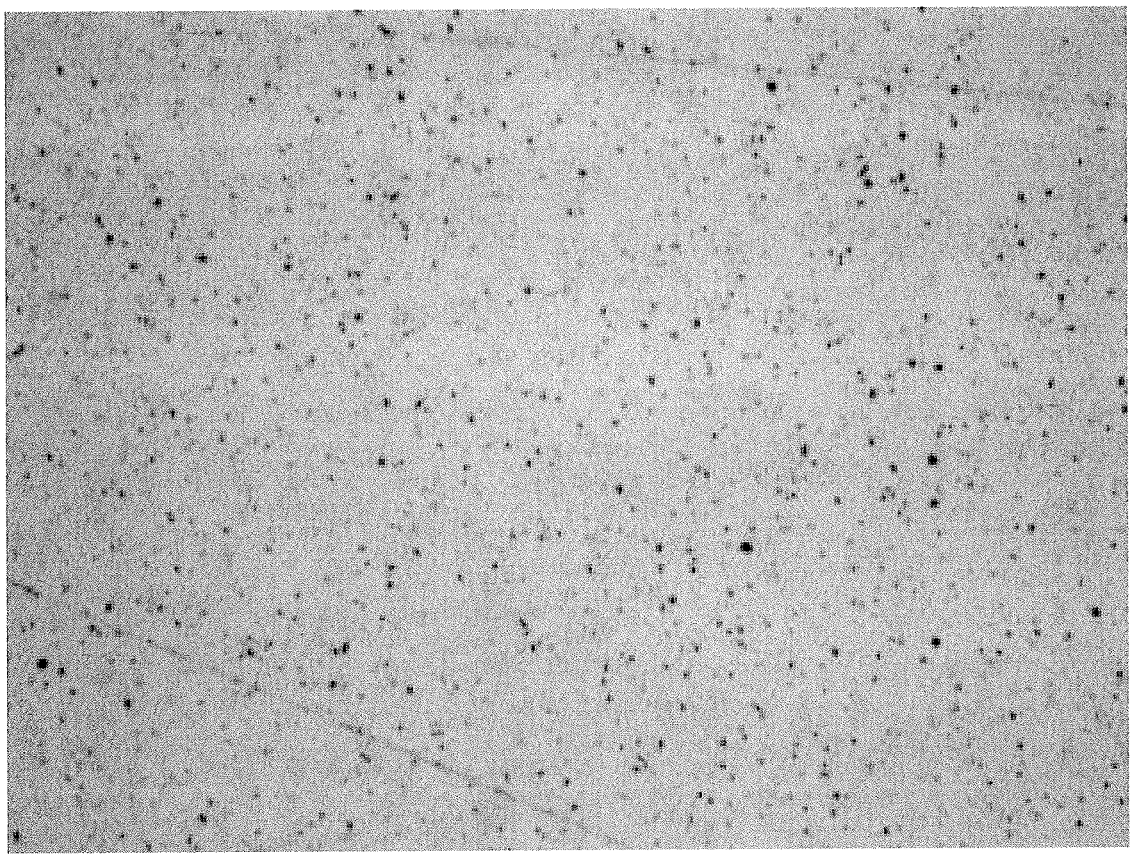

FIGS. 11A and 11B are views illustrating particle defect patterns according to whether the first anode lower electrode 101 includes silver. FIG. 11A illustrates a result obtained after a lift-off process is performed when the first anode lower electrode 101 does not include silver. FIG. 11B illustrates a result obtained after a lift-off process is performed when the first anode lower electrode 101 includes silver.

In FIG. 11B, when the first anode lower electrode 101 includes silver, many particle defects occur. However, as in the present example embodiment, when the first anode lower electrode 101 does not include a silver component and the first anode upper electrode 141 includes a silver component, particle defects of a display apparatus may be reduced.

Although silver is a metal with a high reflectance, it may be difficult to use silver as a single metal, for example, due to a reaction with oxygen or sulfur in the air. Thus, a silver alloy may be considered. However, a silver alloy may exhibit a reflectance lower than that of silver. In the present example embodiment, the first anode upper electrode 141 is formed in a vacuum deposition process and the first anode upper electrode 141 is blocked from external air in a subsequent encapsulation process. Thus, the first anode upper electrode 141 may be formed of pure silver, instead of an alloy.

Figure 10:
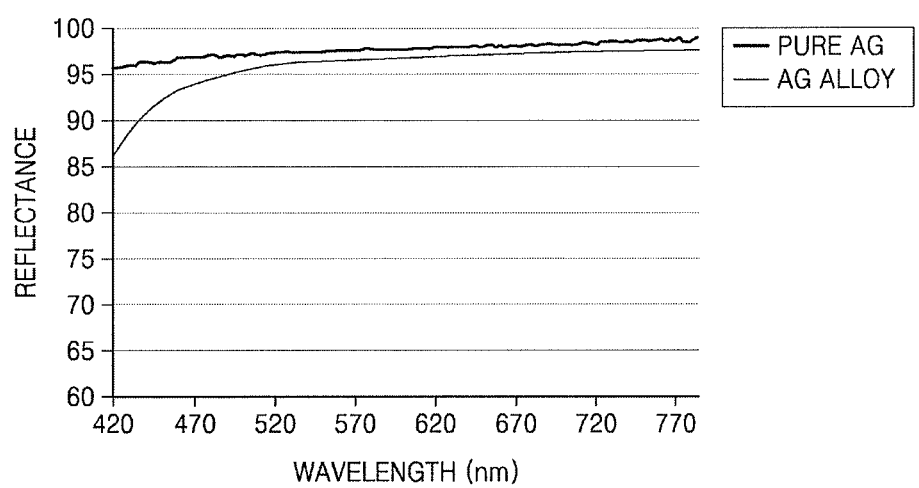
FIG. 10 illustrates a graph showing a relationship between a reflectance and a wavelength of each of pure silver (Ag) and a silver alloy.

FIG. 10 is a graph showing a relationship between a reflectance and a wavelength of each of pure silver and a silver alloy. Since the pure silver has a light reflectance higher than that of the silver alloy and an increase in a reflectance in blue wavelengths equal to or less than 500 nm is large, the efficiency of a blue device may be improved.

Although not shown in the drawings, each of the organic light-emitting display apparatuses may further include an encapsulation member that encapsulates an organic emission layer. The encapsulation member may include a glass substrate, a metal foil, and a thin-film encapsulation layer in which an inorganic layer and an organic layer are combined.

As described above, embodiments may provide an organic light-emitting display apparatus that may reduce defects and manufacturing costs, and a method of manufacturing the organic light-emitting display apparatus.

According to an embodiment, an emission layer may be formed without using a fine metal mask (FMM), and a high resolution display panel may be formed.

Also, according to an embodiment, an anode upper electrode may be deposited in a vacuum. Thus, defects due to a residue formed in a lift-off process may be reduced.

Also, according to an embodiment, an anode upper electrode may be deposited to extend to an inclined surface of a pixel-defining film. Thus, an emission area may be increased and an aperture ratio of a display apparatus may be increased.

Also, according to an embodiment, an anode lower electrode may not include silver. Thus, particle defects due to silver may be avoided.

While one or more embodiments have been described with reference to the figures, it will be understood by those of ordinary skill in the art that various changes in form and details may be made therein without departing from the spirit and scope as defined by the following claims.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
   a substrate;
   lower electrodes, the lower electrodes being on the substrate and spaced apart from one another;
   a pixel-defining film, the pixel-defining film having portions that cover ends of the lower electrodes;
   upper electrodes, each upper electrode corresponding to each lower electrode and including a first portion contacting the corresponding lower electrode and a second portion contacting the pixel-defining film;
   organic functional layers, each organic functional layer including an emission layer and corresponding to each upper electrode and disposed thereon; and
   an electrode on the organic functional layers, the electrode being integrated across a plurality of the organic functional layers; and
   auxiliary electrodes spaced apart from one another, each auxiliary electrode corresponding to an organic functional layer and disposed thereon, each auxiliary electrode being between two adjacent portions of the pixel-defining film to expose tops of the two adjacent portions, and each auxiliary electrode being between the electrode and a corresponding organic functional layer,
   wherein the auxiliary electrodes do not contact the pixel-defining film.

2. The organic light-emitting display apparatus as claimed in claim 1, wherein the upper electrodes include a material with a reducibility that is higher than a reducibility of a material of the lower electrodes.

3. The organic light-emitting display apparatus as claimed in claim 1, wherein the lower electrodes do not include silver (Ag), and the upper electrodes include silver (Ag).

4. The organic light-emitting display apparatus as claimed in claim 3, wherein the upper electrodes include pure silver (Ag).

5. The organic light-emitting display apparatus as claimed in claim 1, wherein the organic functional layers each further include at least one functional layer from among a hole injection layer, a hole transport layer, an electron transport layer, and an electron injection layer.

6. The organic light-emitting display apparatus as claimed in claim 1, wherein:
   the upper electrodes are respectively on inclined surfaces of the portions of the pixel-defining film that cover the ends of the lower electrodes, and
   each upper electrode includes:
      a lower surface, an entirety of the lower surface being in direct contact with a corresponding lower electrode,
      an upper surface, an entirety of the upper surface being opposite the lower surface and in direct contact with a corresponding organic functional layer, and
      a lateral surface connecting the lower surface and the upper surface, an entirety of the lateral surface being in direct contact with a corresponding portion of the pixel-defining film.

7. A method of manufacturing an organic light-emitting display apparatus, the method comprising:
   forming lower electrodes on a substrate, the lower electrodes being spaced apart from one another;
   forming a pixel-defining film, the pixel-defining film having portions that cover ends of the lower electrodes;
   forming a first lift-off layer on the lower electrodes and the pixel-defining film;
   forming a first region corresponding to a first one of the lower electrodes, the first region being formed by removing a first portion of the first lift-off layer;
   sequentially forming, in the first region, a first upper electrode and a first organic functional layer that includes a first emission layer;
   removing a second portion of the first lift-off layer using a first solvent;
   forming a second lift-off layer on the substrate, the second lift-off layer covering the first organic functional layer and the lower electrodes;
   forming a second region corresponding to a second one of the lower electrodes, the second region being formed by removing a first portion of the second lift-off layer;
   sequentially forming, in the second region, a second upper electrode and a second organic functional layer that includes a second emission layer;
   removing a second portion of the second lift-off layer using a second solvent;
   forming a first auxiliary electrode on the first organic functional layer and forming a second auxiliary electrode on the second organic functional layer, the first and second auxiliary electrodes being spaced apart from each other; and
   forming a second electrode on the first organic functional layer and the second organic functional layer, the second electrode being integrated across the first and second organic functional layers,
   wherein each of the first and second upper electrodes includes a first portion contacting a corresponding lower electrode and a second portion contacting the pixel-defining film, wherein each of the first and second auxiliary electrodes is between the second electrode and a corresponding organic functional layer, each of the first and second auxiliary electrodes being between two adjacent portions of the pixel-defining film to expose tops of the two adjacent portions, and wherein the first and second auxiliary electrodes do not contact the pixel-defining film.

8. The method as claimed in claim 7, wherein each of the first and second lift-off layers includes a fluoropolymer.

9. The method as claimed in claim 8, wherein each of the first and second lift-off layers further includes a light-sensitive material.

10. The method as claimed in claim 7, further comprising:
forming a first photoresist on the first lift-off layer; and
forming a second photoresist on the second lift-off layer.

11. The method as claimed in claim 10, wherein:
the first photoresist is patterned where the first region is,
as the first portion of the first lift-off layer is removed, the first lift-off layer is formed with an undercut profile in the first region,
the second photoresist is patterned where the second region is, and
as the second portion of the second lift-off layer is removed, the second lift-off layer is formed with an undercut profile.

12. The method as claimed in claim 7, wherein each of the first solvent and the second solvent includes fluorine.

13. The method as claimed in claim 7, wherein the first upper electrode and the first organic functional layer are formed using a deposition process.

14. The method as claimed in claim 7, wherein the second upper electrode and the second organic functional layer are formed using a deposition process.

15. The method as claimed in claim 7, wherein the first upper electrode is formed of a material with a reducibility higher than a reducibility of the corresponding lower electrode.

16. The method as claimed in claim 7, wherein the lower electrodes do not include silver (Ag).

17. The method as claimed in claim 7, wherein the upper electrodes include silver (Ag).

* * * * *